(12) United States Patent  
Andreas et al.

(10) Patent No.: US 8,826,851 B2  
(45) Date of Patent: Sep. 9, 2014

(54) COVER FOR A ROLLER

(75) Inventors: Mark Andreas, Wangs (CH); Joerg Kerschbaumer, Feldkirch (AT); Stefan Schneider, Valens (CH); Arno Zindel, Maienfeld (CH)

(73) Assignee: Oberlikon Solar AG, Trubbach, Trubbach (CH)

( * ) Notice: Subject to any disclaimer, the term of this patent is extended or adjusted under 35 U.S.C. 154(b) by 1088 days.

(21) Appl. No.: 12/502,615

(22) Filed: Jul. 14, 2009

(65) Prior Publication Data

US 2010/0016136 A1  Jan. 21, 2010

Related U.S. Application Data

(60) Provisional application No. 61/081,472, filed on Jul. 17, 2008.

(51) Int. Cl.
  *B05C 13/02* (2006.01)
  *H01L 31/18* (2006.01)
  *C23C 16/458* (2006.01)
  *C23C 16/54* (2006.01)

(52) U.S. Cl.
  CPC ............ *H01L 31/18* (2013.01); *C23C 16/4583* (2013.01); *C23C 16/54* (2013.01)
  USPC .......................................... 118/500; 118/504

(58) Field of Classification Search
  USPC .......... 492/48, 60; 193/35 TE, 42, 37, 35 SS; 414/529, 535; 220/811, 828, 830; 206/394, 585, 446; 15/104.011, 15/257.06, 3.2, 398, 88.1; 118/500–506
  See application file for complete search history.

(56) References Cited

U.S. PATENT DOCUMENTS

| | | | | |
|---|---|---|---|---|
| 2,129,019 A | * | 9/1938 | Mulvihill | 15/88.2 |
| 2,468,925 A | * | 5/1949 | De Boer | 296/16 |
| 2,620,913 A | * | 12/1952 | Waring | 193/42 |
| 2,702,620 A | * | 2/1955 | Laugle, Sr. | 193/35 SS |
| 3,243,029 A | * | 3/1966 | Oliver | 193/35 SS |
| 3,402,802 A | * | 9/1968 | Lint | 193/37 |
| 3,744,080 A | * | 7/1973 | Smith, Jr. | 15/256.51 |
| 4,555,023 A | * | 11/1985 | Sykes et al. | 206/446 |
| 4,911,279 A | * | 3/1990 | Thunnissen | 193/35 SS |
| 4,930,612 A | * | 6/1990 | Thorndyke | 193/35 SS |
| 4,967,894 A | * | 11/1990 | Thunnissen | 193/35 SS |
| 5,088,585 A | * | 2/1992 | Lambert | 193/35 SS |
| 5,226,632 A | * | 7/1993 | Tepman et al. | 251/335.3 |
| 6,193,043 B1 | * | 2/2001 | Langston et al. | 193/35 SS |
| 6,764,265 B2 | * | 7/2004 | Kunze et al. | 414/217.1 |
| 2002/0175043 A1 | | 11/2002 | Vassel | |
| 2009/0214784 A1 | | 8/2009 | Von Der Waydbrink et al. | |
| 2010/0282628 A1 | * | 11/2010 | Mowe et al. | 206/361 |
| 2012/0240855 A1 | * | 9/2012 | Du et al. | 118/723 R |
| 2014/0000512 A1 | * | 1/2014 | Clauss et al. | 118/500 |

FOREIGN PATENT DOCUMENTS

| | | | |
|---|---|---|---|
| DE | 102006011517 A1 | | 10/2006 |
| GB | 2443480 A | * | 5/2008 |
| JP | 07157080 A | * | 6/1995 |

* cited by examiner

*Primary Examiner* — David Bryant
*Assistant Examiner* — Jacob Cigna
(74) *Attorney, Agent, or Firm* — KPPB LLP

(57) ABSTRACT

A cover for a roller having at least one roller (2) for transporting a substrate (1) in a deposition system and at least one cover means (6), wherein the roller is retractable away from the substrate and the cover means is adapted for at least partly covering the retracted roller against contamination by a substance present in the deposition system. The cover for a roller has the advantage that the uptime of the deposition system is increased.

10 Claims, 5 Drawing Sheets

COVER FOR A ROLLER

CROSS-REFERENCE TO RELATED APPLICATIONS

This invention claims priority to U.S. Patent Application No. 61/081,472, filed Jul. 17, 2008, the entirety of which is incorporated herein by reference.

FIELD OF THE INVENTION

The present invention relates to the field of transporting a substrate in a deposition system. Particularly, the present invention discloses an apparatus and a method for improving process performance of a substrate deposition system.

BACKGROUND OF THE INVENTION

Photovoltaic devices, photoelectric conversion devices or solar cells are devices which convert light, especially sunlight into direct current electrical power. For low-cost mass production thin film solar cells are being of interest since they allow using glass, glass ceramics or other rigid or flexible substrates as a base material, i.e. a substrate, instead of crystalline or polycrystalline silicon. The solar cell structure, i.e. the layer sequence responsible for or capable of the photovoltaic effect is being deposited in thin layers.

The deposition of said layers is typically done in a CVD system. The reactants, e.g. precursor materials, are being fed into process stations by a so called gas shower. The substrate, e.g. a workpiece, to be treated, e.g. coated, is being placed and heated on a hot plate, i.e. a substrate carrier, to establish a preferred environment for the deposition on the surface of the substrate. Normally, at least a fraction of these reactants are deposited, whereas the residuals are being removed via exhaust means, e.g. a vacuum pump.

With conventional systems, the substrates are being transported horizontally through the system by sets of rollers, supporting the substrates from beneath. Typical substrates are rectangular or square sheets of glass, glass ceramics or crystalline glass, plastic or even metal. The rollers are usually actuated e.g. by motors via a driveshaft.

As these rollers are arranged within a process chamber, e.g. a process station of a CVD system, they are exposed to the process gases, such as reactants and/or precursor substances, and will thus get coated over time. This coating negatively influences the process performance of the system. Firstly, the rollers will get contaminated by the coating and during further use the coating on the roller will be transferred to the lower side of the substrates and will stick to it. Thus the performance of subsequent systems further treating the substrate is influenced negatively. Secondly, the coating of O-rings arranged on the roller for transporting the substrate will slowly build up and start to flake off at a certain film thickness. These flakes contaminate the process chamber and influence the coating of the substrates negatively.

Consequently, there exists a need for improving process performance of such systems.

SUMMARY OF THE INVENTION

It is an object of the present invention to improve process performance of a substrate treatment system, particularly to improve the performance of a roller used in a substrate treatment system.

This object is achieved by the independent claims. Advantageous embodiments are given in the dependent claims.

Thus, this object is achieved by a device comprising at least one roller for transporting a substrate in a deposition system and at least one cover means, wherein the roller is retractable away from the substrate and the cover means is adapted for at least partly covering the retracted roller against contamination by a substance present in the deposition system.

Accordingly, it is an essential idea of the invention to at least partly cover the retracted roller from being affected by the deposition. Advantageously, the retracted and at least partly covered roller and/or at least some critical parts of the retracted roller are/is shielded against becoming contaminated by the coating originating from process gases, e.g. from precursor substances, used in the deposition system.

Furthermore, the such shielded rollers will not negatively affect another substrate when becoming un-retracted, i.e. extended, and transporting the another substrate. Thus, the invention avoids any negative influence arising from substances used in the deposition system, such as precursor substances and/or reaction products of the precursor substances, and affecting the roller for not decreasing the performance level of subsequent systems further treating the substrate. In other words, it was unexpectedly found that avoiding any undesired coating on the roller that negatively affects the quality and/or performance of the deposition system can be achieved by at least partly shielding the roller during process steps of the deposition system. In this way, process gases cannot reach the surface of the roller and deposit there. It is especially preferred that the retracted roller is covered by the cover means. In an even more preferred embodiment the retracted roller is completely covered by the cover means.

It is especially preferred that the deposition system is adapted for photovoltaic device manufacturing, i.e. the deposition system allows the manufacturing of a photovoltaic device, e.g. based on the substrate.

According to the invention, the roller can be retracted in order to reduce the effect of subsequent treatment steps on it. The term "retracting" means the removing of the roller away from the substrate, i.e. away from the working position in which the roller supports the substrate, preferably from beneath, e.g. within the deposition system. Once retracted from the substrate, the roller is at least partly covered by the cover means against a substance used e.g. in photovoltaic device manufacturing. Once the desired treatment with the precursor substance has taken place, the roller will be un-covered, i.e. extended, to return to its working position, the substrate is being placed on the roller by lowering the substrate support and the substrate can be transported. Preferably, the deposition system comprises a plurality of rollers, e.g. situated in such manner, that one part of the rollers is arranged on one side of the substrate and another part of the rollers is arranged on the other side of the substrate. In another embodiment, the substrate is only contacted from the rear side on its lower surface. Thus, no substrate carrier or frame is necessary. Having arrived in the desired position, a substrate support, e.g. a hot table, is being elevated from a lower position to lift the substrate from the roller.

The cover means can be provided as any suitable cover means known from the prior art. Preferably, the cover means is provided as a flap, as a flap door, as a cover, as an enclosure shielding, as a barrier, as a plate and/or as a plate comprising an opening. In an even more preferred embodiment, the cover means comprises a material that is resistant against substances used in photovoltaic device manufacturing, as e.g. aluminium or metal, thus, the material of the covers means provides a sufficient and persistent protection against such precursor substances, i.e. process gases, used e.g. in photovoltaic device manufacturing. In another embodiment the cover means is adapted for completely covering the retracted roller.

Preferably, the deposition system is selected from the group consisting or a CVD system, a PCD system, a PECVD system, an APCVD system and/or an MOCVD system. Most preferably, the deposition system is a "TCO 1200" supplied by Oerlikon Solar, known in the market. The "TCO 1200" is a linear inline CVD system with process station arranged linearly subsequently in a row. It is furthermore preferred that the roller is arranged within the deposition system. In a further embodiment the roller is provided as any suitable means for transporting a substrate in a deposition system, e.g. a belt or a substrate support means. The substrate can be any suitable substrate known from the prior art, which is preferably usable for manufacturing a thin-film photovoltaic device or at least a part of a thin-film photovoltaic device. Preferably the pressure regime in the deposition system can vary, depending on the process, between near atmospheric conditions, e.g. a few hundred hPa, to vacuum conditions, e.g. $10^{-1}$ to $10^{-5}$ hPa.

According to another preferred embodiment of the invention, the roller is adapted for closing and/or for opening the cover means. In one embodiment the roller is adapted for closing the cover means while retracting away from the substrate and/or the roller is adapted for opening the cover means while extending towards its previous working position, i.e. towards the position in which the roller is adapted for transporting the substrate. Such, as the roller is able to close and/or to open the cover means itself, the embodiment allows for a very simple realisation of the device according to the invention.

In another preferred embodiment of the invention, the cover means comprises a counterweight means and/or a spring means which are adapted for opening the cover means. The counterweight means, which can be any suitable weight as known from the prior art, e.g. a metal weight, is adapted for opening the cover means due to its gravitational weight, thus providing a very simple mechanism for opening the cover means. The spring means, which can be provided as any spring type known from the prior art, is preferably loaded with spring load when closing the cover means, thus, the spring load of the spring means effectuates the opening of the cover means. More preferably, the counterweight means and/or the spring means, respectively, are/is adapted for opening the cover means while extending the roller towards its working position to support the substrate during transport. In one embodiment, the counterweight means is dimensioned such that the cover means remains in its open-position without any external support.

According to another preferred embodiment of the invention, the cover means comprises a protrusion means and the protrusion means is adapted for closing the cover means while retracting the roller. In a further embodiment, the roller, or any other suitable part of the roller, such as a board-wheel, acts on the protrusion means for closing the cover means while retracting away from the substrate. Such embodiments, i.e. the counterweight means, the spring means and/or the protrusion means, allow a very simple and effective design of the overall system, i.e. the device, thus not requiring any other additional actuators and/or controls, as the cover means is actuated by the movement of the roller from its retracted position into its extended position and vice versa.

According to another preferred embodiment of the invention, the cover means is adapted for rotating around an axis and the axis is parallel or perpendicular to the direction of the retraction movement of the roller and/or the cover means is adapted for sliding perpendicular to the direction of the retraction movement of the roller. Parallel and/or perpendicular also means that further variations to parallel and perpendicular are included as well, such as, for example, +/−1°, 2°, 5°, 10° and/or 20° to the parallel and/or perpendicular direction. Preferably, the movement of the roller back and forth from the retracted into the extended position, and vice versa, is transferred into a rotary, swivelling and/or pivoting movement of the cover means. In this way, the cover means is preferably provided as a pendulum and/or a slider like cover. Transferring the movement of the roller into the rotary, swivelling and/or pivoting movement can be achieved, for example, by a guide pin, whose lower end is being actuated by the back and forth movement of the roller. Preferably, the upper end of the guide pin engages with a guiding groove in the axis parallel to the direction of the retraction movement. The guiding groove may exhibit a screw thread like shape, thus forcing the before mentioned axis to turn while the pin is being linearly moved. Such an embodiment results in a simple and effective opening and/or closing movement.

In another embodiment, the cover means can be actuated by a torsion spring. Preferably, the cover means is provided as a flap or as a door, which is rotatable around an axis perpendicular to the direction of the retraction movement. In a further preferred embodiment, the cover means is adapted for sliding perpendicular to the direction of the retraction movement of the roller, thus the cover means is preferably provided as an elongated shield, e.g. from metal, and, for example, comprising an opening so that the roller can be retracted and/or extended through the opening. For shielding the roller, the cover means is slided perpendicular to the direction of the retraction movement of the roller so that the opening is not provided in front of the roller anymore. In this way, the cover means can be actuated, for example, via a pressurized cylinder and/or another means for providing a preferably linear movement. It is especially preferred to provide such cover means with a plurality of openings for shielding a plurality of rollers, such that each opening shields respectively allows the retraction respectively extending movement of each one roller.

According to another preferred embodiment of the invention, the cover means comprises a board-wheel for guiding the substrate. In this way, the board-wheel provides shielding against contamination of the roller, which is preferably achieved by retracting the roller to be shielded behind the board-wheel. In a further preferred embodiment the board-wheel is attachable to the roller by a spring means adapted for extending the roller. Such embodiments allows the compression of the spring means, which can be provided as any spring known from the prior art, while retracting the roller behind the board-wheel, i.e. the board-wheel is adapted for shielding the roller, so that the spring means is preferably completely compressed in an end position of the retracted roller. Preferably, the board-wheel comprises a bigger diameter than the part of the roller transporting the substrate.

In another embodiment, the device comprises a cleaning means for cleaning the roller while retracting the roller from the substrate and/or while extending the roller towards the substrate. This provides an easy way for preferably mechanically removing brushes from the roller during the retracting respectively extending movement of the roller, for example prior to a next contact of the roller with the substrate. It is furthermore preferred that such cleaning step is carried out, for example, by a circular brush surrounding the roller.

The substance can be any substance present in a deposition system preferably for photovoltaic device manufacturing However, according to another preferred embodiment of the invention, the substance is a precursor substance and/or a reaction product of the precursor substance. In a further embodiment the substance is selected from the group consisting of pyrophoric metalorganic chemicals, phosphine, diborane, silane, dimethylzinc and/or diethylzinc. In another embodiment, the substance is a reaction product of pyrophoric metalorganic chemicals, phosphine, diborane, silane, dimethylzinc and/or diethylzinc. For example, the reaction product can be zinc and/or zinc oxide, or any other metallic or oxidic deposition resulting from the deposition process and/or present in the deposition system, e.g. in a CVD system.

In another preferred embodiment of the invention the deposition system is used for thin-film deposition, more preferably for ZnO thin-film deposition. The deposition may take place under atmospheric or vacuum conditions. In a further embodiment the deposition system is used for the deposition of thin layers. In a preferred embodiment, the deposition system is a large-scale and/or industrial size deposition system as such systems of bigger size process greater amounts of precursor substances, e.g. for manufacturing thin-film photovoltaic devices having a size of 1.1 m×1.3 m.

In a further embodiment of the invention, the roller comprises an O-ring for transporting the substrate and the cover means is adapted for covering the O-ring. The O-ring increases the friction between the roller and the substrate to avoid slipping and to allow a more precise location control of the substrate. Thus, covering the O-ring with the cover means avoids contamination of the ring negatively affecting process performance. Thus, the invention allows for reducing manufacturing costs as the O-ring must be replaced less frequently compared to prior art systems. Furthermore, the invention avoids, i.e. reduces, the recycling of contaminated rollers and/or O-rings, as the cover means shields the roller and/or the O-ring against process gases. The O-ring can be provided in any suitable material for transporting the substrate, e.g. the O-ring may comprise a rubber or a rubber-like material.

In another preferred embodiment of the invention, the cover means comprises an adjustment element for mounting inside the deposition system and a removable element for at least partly covering the retracted roller. Such an embodiment increases the uptime of the system, i.e. of the device, and allows for an easy maintenance, as the cover means is divided into a first element, i.e. the adjustment element, that is preferably only mounted once inside the deposition system, and the second element, i.e. the removable element, that is subject to maintenance and easy to remove from the deposition system. In this way, the time absorbing adjustment of the adjustment element is only done once, while the removable element can be very efficiently mounted within the deposition system, for example, after maintenance, without any time consuming adjustment.

The uptime of the overall system, i.e. of the device and/or of the deposition system, can be further increased by dividing a plurality of cover means into groups with equal maintenance frequencies. Thus, for a regular maintenance, only elements with an equal contamination and thus equal maintenance frequency have to be exchanged, repaired or cleaned at a time. Cover means that are less exposed to deposition may stay longer inside the deposition system and need to be submitted to maintenance on less frequent intervals. In turn, such embodiments increase the uptime of the system. Further methods for increasing the uptime may include embodiments such as modifying the surface of the roller and/or the O-ring to increase adhesion of the deposition, e.g. by selecting a material for the roller, such as metal, and/or the O-ring, such as rubber, that allow an easy and simple cleaning. Thus, such an embodiment results in decreased cleaning costs as well as in decreased abrasive damage of the surface of the roller and/or the O-ring reducing the lifetime of the roller.

The object of the invention is further achieved by a method for protecting at least one roller adapted for transporting a substrate in a deposition system, comprising the steps of a) Retracting the roller away from the substrate; and b) At least partly covering the retracted roller against contamination by a substance present in the deposition system.

Unexpectedly, it has been found that a roller at least partly covered in such way according to the invention improves overall process performance of the deposition system, as the retracted and at least partly covered roller and/or at least some critical parts of the retracted roller being shielded against becoming contaminated by the coating originating from process gases, e.g. from precursor substances used in photovoltaic device manufacturing, has an improved lifetime and decreased maintenance downtime.

According to another preferred embodiment of the invention, step b) is caused by step a) and/or step b) is accomplished at least partly during step a). This means that already during retracting the roller the roller is at least partly covered, thus allowing a very fast covering of the roller. This means further that the movement of the roller causes the step of covering the roller. In another preferred embodiment, the method further comprises the step of c) Extending the roller towards the substrate, whereby the roller is uncovered.

Preferred embodiments for the method according to the invention emerge in an analogue manner to the above described device.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
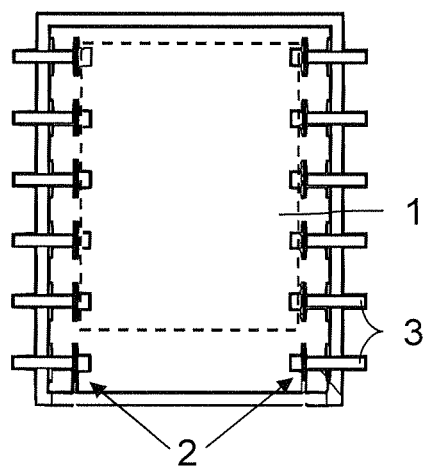
FIG. 1 shows a part of deposition system with a substrate transported on a plurality of rollers according to prior art in a top view.

FIG. 1 shows a part of deposition system with a substrate 1 transported on a plurality of rollers 2 according to prior art in a top view. The rollers 2 are being actuated e.g. by motors via a driveshaft 3. The substrate 1 is thus only contacted from the rear side on the lower surface. No substrate carrier or frame is necessary. Having arrived in the desired position, a substrate support, e.g. a hot table is being elevated from a lower position to lift the substrate 1 from the rollers 2. The rollers 2 can then be retracted away from the substrate 2 in order to reduce the effect of subsequent treatment steps on them. After the desired treatment within the deposition system has taken place, the rollers 2 will return to their previous working position, the substrate 1 is being placed on the rollers 2 by lowering the substrate support and the substrate 1 can be transported.

Figure 2:
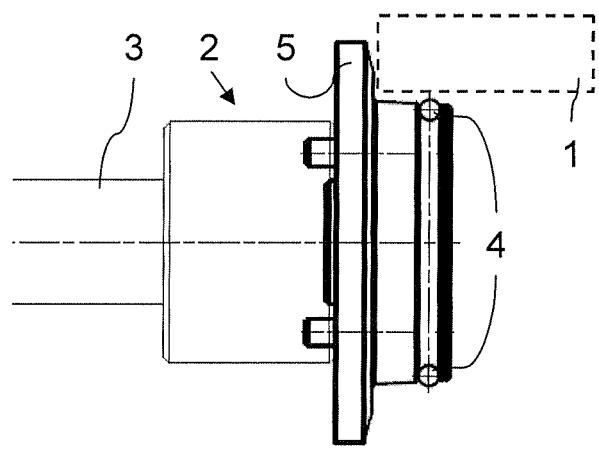
FIG. 2 shows a part of a roller according to prior art in a side-view.

More precisely shown in FIG. 2, the substrate 2 is in contact with an O-ring 4 mounted on a roller 2 to support substrate 1 and increase the friction between the roller 2 and the substrate 1 to avoid slipping and allow for a precise location control. Board-wheel 5 attached to the roller 2 gives guidance to the substrate 1 perpendicular to the transport direction.

In a first embodiment, the roller 2 and the O-ring 4 are shielded from deposition by a cover means 6, provided as a cover. The coating of the rollers 2 and the O-rings 4 can be inhibited by covering the rollers during process steps of the deposition system and thus avoid said unwanted coating as the process gases can not reach the surface of the roller 2 and/or O-ring 4 and deposit there.

According to one embodiment, as shown in FIG. 3 and FIG. 4, the linear motion of the rollers 2 can be used to actuate a mechanism, which acts on a cover means 6 shielding the rollers 2. Flap doors can be used as cover means 6 that open as soon as the rollers 2 extend into the process region. This mechanism can be used on an individual roller 2 as well as for more rollers 2 at a time, as well as for all rollers 2 in a process chamber of a deposition system together.

Figures 3A, 3B:
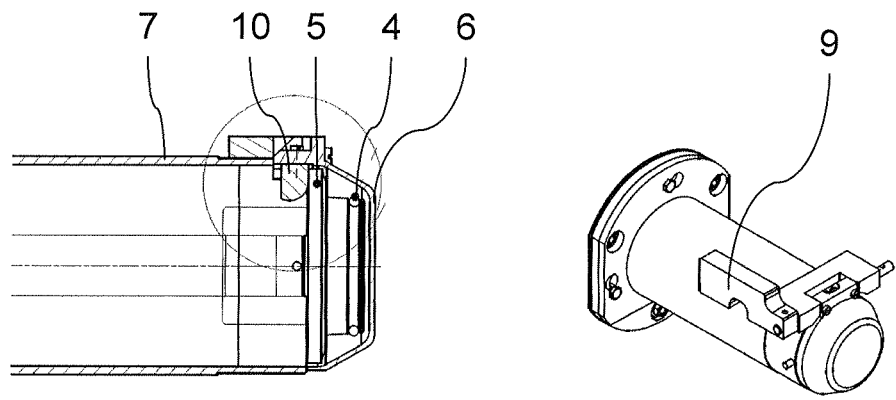
FIG. 3 shows a device with a closed flap-like cover means according to a preferred embodiment of the invention in a side view as FIG. 3a and in a perspective view as FIG. 3b.
Figures 4A, 4B:
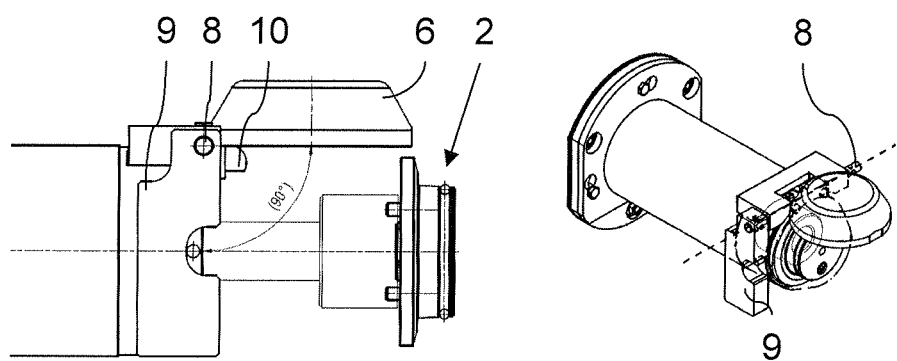
FIG. 4 shows the device with an open flap-like cover means according to the preferred embodiment of the invention in a side view as FIG. 4a and in a perspective view as FIG. 4b.

FIG. 3a is showing board-wheel 5, a groove for O-ring 4 and the roller 2 in a cross sectional view. FIG. 3b shows the device according to the invention in a perspective view. The roller 2 plus its driveshaft 3 is being encased and/or surrounded by an enclosure 7, e.g. a casing or pipe section, which has a door means 6 provided as a flap at its end, which can swivel around an axis 8. The roller 2 is moved to a forward position shown in FIG. 4a and FIG. 4b, i.e. towards a working position to support the substrate 1 during transport. The cover means 6 will open due to the gravitational weight of a weight means 9 provided as weight piece and attached to the cover as shown in FIG. 4a and FIG. 4b. The weight piece is dimensioned such that the flap will remain in its open-position without external support. As soon as the roller 2 retracts, the board-wheel 5, or another suitable part of the roller 2, acts on a protrusion means 10 and/or on a lever to close the cover means 6 and protect the roller 2 and the O-ring 4 from contamination. The combination of said protrusion 10 plus counterweight means 8 allows keeping the whole device very simple and effective. No additional actuators or controls are necessary; the flap will be actuated indirectly by the linear movement of the roller 2 which does not require huge forces.

Figure 5:
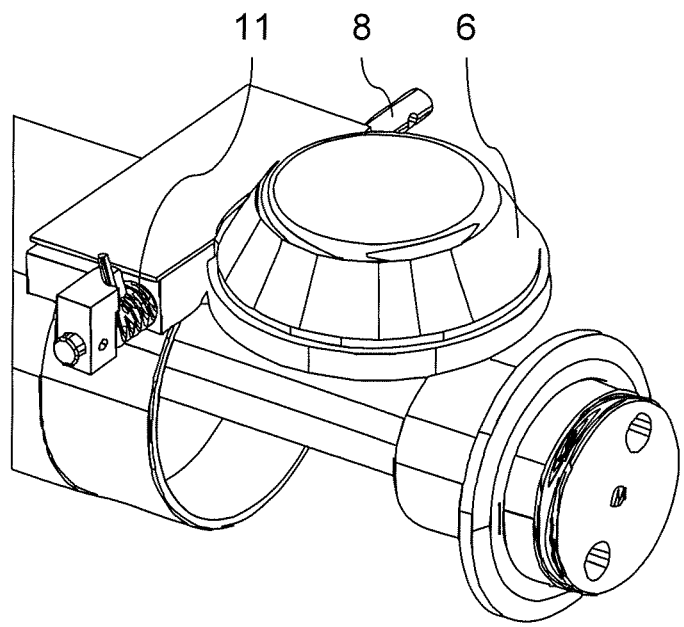
FIG. 5 shows a device with a spring-actuated cover means according to another preferred embodiment of the invention in a perspective view.

Several other technical solutions can implement this principle, for example using a spring means 11 to actuate the cover means 6, as shown in FIG. 5. The spring means 11 functionally replaces in this case the counterweight means 9.

Figure 6:
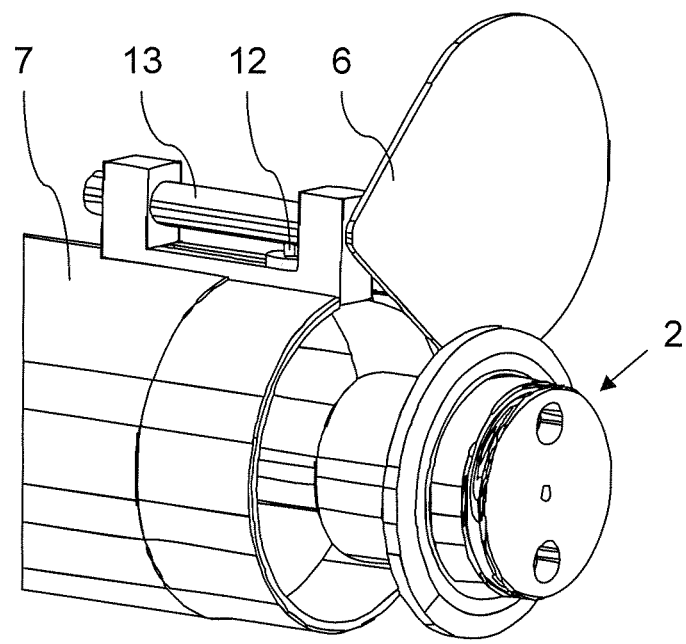
FIG. 6 shows a device with a slider-like, swivelling cover means according to another preferred embodiment of the invention in a perspective view.

Another embodiment is shown in FIG. 6 using a pendulum, or slider, like cover means 6, transferring the linear motion of the roller 2 back and forth into a rotary, e.g. into a swivelling and/or pivoting, motion of the pendulum like cover means 6. This can be achieved by a guide pin 12, whose lower end is being actuated by the back and forth movement of the roller 2. The upper end of guide pin 12 engages with a guiding groove, not shown, in the axis 13. Said guiding groove may exhibit a screw thread like shape, thus forcing axis 13 to turn while guiding pin 12 is being linearly moved. This again results in an opening respectively closing movement of the cover means 6. Alternatively, the pendulum cover means 6 can be actuated by a torsion spring.

Figure 7:
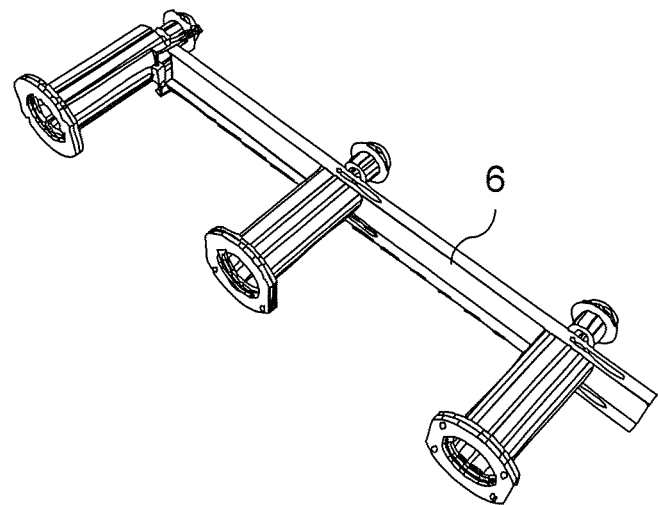
FIG. 7 shows an arrangement of device with a slider-like, linearly actuated cover means according to another preferred embodiment of the invention in a perspective view.

A further embodiment shows a cover means 6 not only for one enclosure but to cover all rollers 6 at a time as shown in FIG. 7. This can be achieved by an elongated shield, e.g. from metal, with respective openings, which is actuated e.g. via a pressurized cylinder or another means providing for a linear movement.

Figure 8:
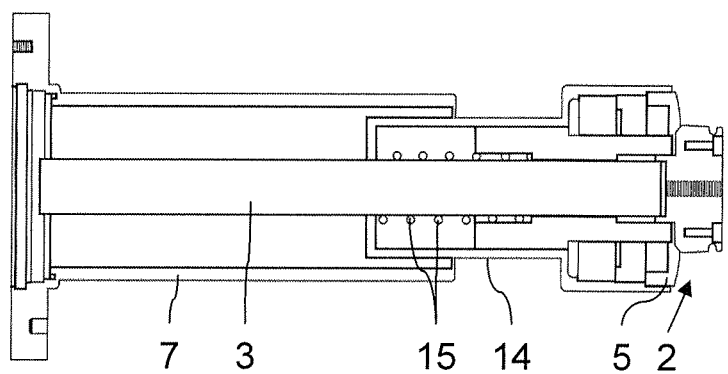
FIG. 8 shows a device with a cover means provided as O-ring according to another preferred embodiment of the invention in a section view.
Figure 9:
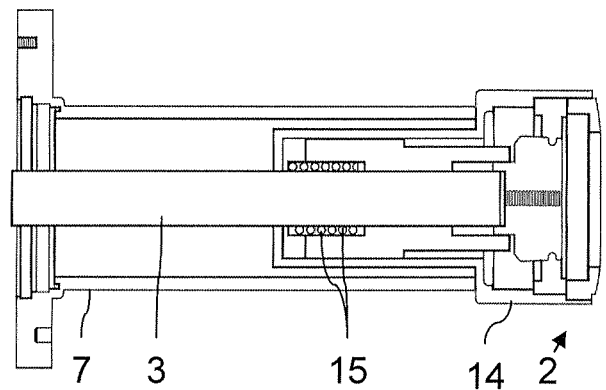
FIG. 9 shows the device with the cover means provided as O-ring according to the another preferred embodiment of the invention in a section view.

A variant uses the board-wheel 5 to provide for shielding against contamination of the O-ring 4. This is achieved by retracting the roller 6 to be shielded behind the board-wheel 5. This embodiment is illustrated in FIG. 8 and FIG. 9. A shielding subassembly 14 is arranged movably in relation to enclosure 7. A spring 15 links subassembly 14 and driveshaft 3. In FIG. 8 roller 2 is in its working position. When the driveshaft 3 with roller 6 is being retracted, subassembly 14 will impinge on enclosure 7 and the spring 15 will be compressed. Thus the roller 2 will slide into subassembly's 14 shielding behind board-wheel 5. FIG. 9 shows the end position with completely compressed spring 15 and retracted roller 2.

Figure 10:
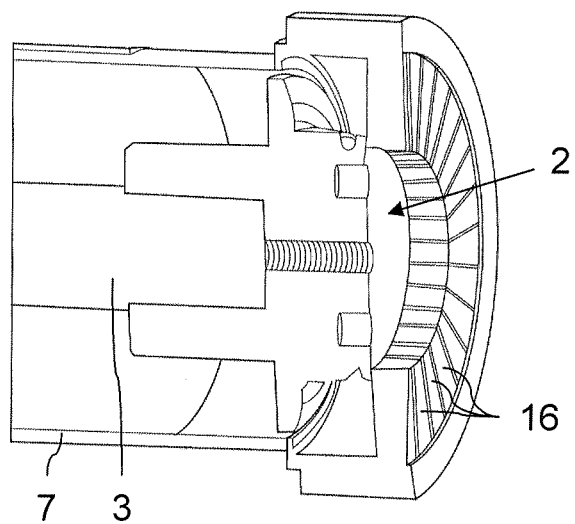
FIG. 10 shows a device with a cover means and a cleaning means according to another preferred embodiment of the invention in a section view.

Within a further variant of the invention, as shown in FIG. 10, depositions can be mechanically removed by cleaning means 16, e.g. brushes, from roller 6 and the O-ring 4. Basically a cleaning step is introduced between each in-out movement to remove deposited layers prior to the next contact with the substrate 1. The cleaning process can be done by using e.g. a circular brush to clean the O-ring's 4 surface each time the roller 6 is moved back and forth, as indicated in FIG. 10.

While the invention has been illustrated and described in detail in the drawings and foregoing description, such illustration and description are to be considered illustrative or exemplary and not restrictive, the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. Device for use within a deposition system for photovoltaic device manufacturing comprising
    at least one roller for transporting a substrate in the deposition system and
    at least one cover means comprising a material that is resistant against substances and reaction products of the substances used in photovoltaic device manufacturing, wherein the roller is adapted for closing and/or for opening the cover means, and wherein
    the roller is retractable away from the substrate, and wherein
    the cover means is adapted for at least partly covering the retracted roller against contamination by a substance present in the deposition system, and
    a cleaning means for cleaning the roller while retracting the roller from the substrate and/or while extending the roller towards the substrate.

2. Device according to claim 1, wherein the retracted roller is covered by the cover means.

3. Device according to claim 1, wherein the cover means comprises a counterweight means and/or a spring means which are adapted for opening the cover means.

4. Device according to claim 1, wherein the cover means comprises a protrusion means and the protrusion means is adapted for closing the cover means while retracting the roller.

5. Device according to claim 1, wherein the cover means is adapted for rotating around an axis and the axis is parallel or perpendicular to the direction of the retraction movement of the roller and/or the cover means is adapted for sliding perpendicular to the direction of the retraction movement of the roller.

6. Device according to claim 1, wherein the substance is a precursor substance and/or a reaction product of the precursor substance.

7. Device according to claim 1, wherein the roller comprises an O-ring for transporting the substrate and the cover means is adapted for covering the O-ring.

8. Device according to claim 1, wherein the cover means comprises an adjustment element for mounting inside the deposition system and a removable element for at least partly covering the retracted roller.

9. Device according to claim 1, wherein the cover means comprises a board-wheel for guiding the substrate.

10. Device according to claim 9, wherein the board-wheel is attachable to the roller by a spring means adapted for extending the roller.

* * * * *